United States Patent [19]

Eyraud

[11] Patent Number: 4,840,836

[45] Date of Patent: Jun. 20, 1989

[54] STRETCHED, COMPOSITE POLYESTER FILMS USABLE PARTICULARLY FOR GRAPHIC ARTS

[75] Inventor: Marcel Eyraud, Lyons, France

[73] Assignee: Rhone-Poulenc Films, Courbevoie, France

[21] Appl. No.: 262,172

[22] Filed: Oct. 17, 1988

Related U.S. Application Data

[63] Continuation of Ser. No. 6,544, filed as PCT FR86/0018 on Apr. 11, 1985, published as WO86/06024 on Oct. 23, 1986, abandoned.

[30] Foreign Application Priority Data

Apr. 15, 1985 [FR] France ............................. 85 05841

[51] Int. Cl.$^4$ .................. B32B 7/02; B32B 27/08; B32B 27/36
[52] U.S. Cl. ................................... 428/213; 264/171; 264/177.2; 428/220; 428/323; 428/480
[58] Field of Search .............. 428/220, 323, 212, 480, 428/325, 213, 347, 324; 264/171, 177.2

[56] References Cited

U.S. PATENT DOCUMENTS

| | | | |
|---|---|---|---|
| 3,515,626 | 6/1970 | Duffield | 428/325 |
| 3,983,285 | 9/1976 | Riboulet et al. | 428/212 |
| 4,375,494 | 3/1983 | Stokes | 428/323 |
| 4,399,179 | 8/1983 | Minami et al. | 428/212 |
| 4,533,509 | 8/1985 | Gust et al. | 264/171 |

FOREIGN PATENT DOCUMENTS

| | | | |
|---|---|---|---|
| 0035835 | 9/1981 | European Pat. Off. | 428/347 |
| 0053498 | 6/1982 | European Pat. Off. | 428/480 |
| 1469837 | 1/1967 | France | 428/324 |
| 1397653 | 6/1975 | United Kingdom | 428/212 |

OTHER PUBLICATIONS

English translation of Japanese Patent No. 53-125479, Nov. 1, 1978, Kawakami et al.(1), pp. 1–5.
English translation of Japanese Patent 54–15979, Feb. 6, 1979, pp. 1–19, Kawakami et al.(2).

*Primary Examiner*—Thomas J. Herbert
*Attorney, Agent, or Firm*—Burns, Doane, Swecker & Mathis

[57] ABSTRACT

A thick composite polyester film of between 40 and 300 microns in thickness being crystalline or semicrystalline comprising drawn unfilled layer (A) of thickness e, covered on at least one surface thereof with a thin drawn filled layer (B) of thickness $e_2$, having an overall roughness greater than 0.3 microns and being filled with inert particles wherein the volume median diameter of the filler being at least equal to the thickness of layer (B); the thickness ratio of layers (A) and (B) denoted by $e_1/e_2$ is lower than 5% and the percentage of scattered light transmitted from the composite film is lower than 7.

6 Claims, No Drawings

STRETCHED, COMPOSITE POLYESTER FILMS USABLE PARTICULARLY FOR GRAPHIC ARTS

This application is a continuation, of application Ser. No. 006,544, filed as PCT FR86/00118 on Apr. 11, 1985, published as WO86/06024 on Oct. 23, 1986, now abandoned.

The present invention relates to drawn composite polyester films, in particular for graphic arts, having good processability, excellent transparency and which are particularly suitable for use in machines which manufacture printing forms for offset plates.

The films used in the graphics industry are relatively thick films (thickness in general between 30 and 300 microns), having high transparency but whose machinability it would be desirable to improve; machinability means the film's suitability for being handled conveniently without special difficulties during use (blocking etc) and without loss of film qualities (change in its surface characteristics, damage, wear, scratching, breakage etc). This suitability can sometimes be referred to by the term workability. The processes employed in graphics arts are essentially: winding, unwinding, dereaming (for example in photocopying), and laying down (for example during the preparation of printing forms for reproducing machines and printing frames).

It is well known that the properties of transparency and of processability are in opposition and that the best compromise must be found between them in each use.

It is known, in fact, that machinability may be obtained by introducing into the polymer of which the film is made fine, generally inorganic, particles which endow the film surface with protuberances ensuring the good slip properties necessary for correct fitting of the reels. The presence of these fillers obviously reduces the transparency of the film and does not make it possible to obtain a low value for the percentage of scattered light in the transmitted light.

Coextrusion methods make it possible to manufacture composite films having thin outer layers which are filled [and hence contribute slip] without introducing a filler into the middle layer. This results in films which offer an advantageous compromise between transparency and machinability.

Complex or multilayer films used in graphic arts are described, for examples, in French Pat. Nos. 1,469,837, 2,177,471 and 2,232,426.

In French patent No. 1,469,837 there are described drawn composite films for graphic arts, consisting of at least one thin filled outer layer adjoining a thicker unfilled layer. The particles have an average size of between 2 and 20 microns and are introduced in a quantity ranging from 500 to 50,000 ppm. These films, in which the thickness of the outer layer represents from 5 to 25% of the overall thickness of the laminate, are thin films, with an overall thickness of between 25 and 50 microns; these films have good machinability and exhibit a considerably increased transparency compared with the single-layer film of the same thickness.

The Applicant Company's French Pat. Nos. 2,177,471 and 2,232,426 describe coextruded films in which an outer layer contains fine particles originating from the catalyst residue and thus contributing slip properties.

Thick, optionally coextruded films have also been prepared, having good frictional properties (total roughness of between 0.050 and 0.3 micron under well-defined measurement conditions) and having a particularly low percentage of scattered light (also referred to by the term of haze in the technology in question) by introducing into the film, before biaxial drawing, a very low quantity (less than 200 ppm) of a fine filler consisting of a mixture of particles of different chemical nature and each having a weight median particle size greater than 0.4 micron [Teijin Kokai Japanese patent applications Nos. 53/125,479 and 54/15,979].

In European patent application 0,124,310 there are also described thin polypropylene composite thermoplastic films with filled outer layers, of low haze, and machinable [low friction coefficient], containing a relatively high quantity of filler [5000 to 10,000 ppm] and having a median diameter of between 0.2 and 5 microns and usable in the packaging field, in which their sealability properties are used to advantage. These films have a thickness which is less than or equal to 20 microns. There is a suggestion in this document of the possibility of replacing the polypropylene with various other thermoplastics but in the intended application the replacement is generally not possible, bearing in mind the excessive differences in the properties of the polymers employed.

In the case of the graphic arts applications, an important stage concerns the manufacture of the printing forme required for the manufacture of offset plates. This is prepared with the aid of blocking plates made of thermoplastic films and generally of polyester. In addition to the transparency, the machinability, the anti-Newton character [a property consisting in avoiding the appearance of Newton's rings due to light interference when two films are laid over one another or when a film is arranged on a glass plate], the blocking plates made of polyester films must be capable of lending themselves readily to being used and, in particular, being positioned at a high rate in industrial machines. In the manufacture of offset plates, however, the step of laying down the blocking plate under vacuum in the UV exposdure frames is frequently long and consequently determines the overall rate of production. This is particularly true in the manufacture of large plates with a surface area which is generally between 0.7 and 2.5 m$^2$, where the plating time on a frame may be up to 30 minutes.

The usual polyester films are unsuitable for an application of this type; a solution has meanwhile been found in coating resin filled with fine particles onto a transparent polyester film. However, these films require a repeated coating onto a finished film which has already undergone a biaxial drawing treatment.

There has been no solution hitherto in the field of the films which are obtained directly on industrial lines. A problem which therefore arose was to develop polyester films capable of being produced directly on industrial machines without the use of a coating treatment, suitable for the graphic arts application defined above and at the same time having good transparency, good machinability, the anti-Newton character and capable of being used at a high rate especially in the machines for manufacturing printing formes.

The invention meets precisely this objective and claims thick, drawn composite polyester films obtained directly on an industrial machine without coating, these films having a high transparency [percentage of dispersed transmitted light less than 7], a thickness of between 40 and 300 microns, and a high surface roughness permitting a high rate of use and the removal of the Newton's rings phenomena. These films have a low friction coefficient.

More accurately, the subject of the present invention consists of thick composite polyester films with a thickness of between 40 and 300 microns, drawn, crystalline or semicrystalline consisting of a drawn layer (A) of thickness $e_1$, this layer (A) being substantially unfilled and being covered over at least one of its faces with a thin drawn layer (B) of thickness $e_2$, the layer (B) having a total roughness greater than 0.3 micron, characterized in that:

the ratio of the thicknesses of the layer (B) relative to the layer (A), denoted by $e_2/e_1$, is less than 5% the percentage of light scattered by the composite film is less than 7.

The films of the present invention are particularly remarkable in the sense that they permit times for positioning on a frame which are much shorter [between 5 and 30 times shorter than those relating to the standard films] while possessing excellent transparency, the anti-Newton character and good processability.

It is noted, furthermore, that the images produced with the aid of the films of the present invention quite frequently possess better image definition qualities than those obtained with the traditional films.

Advantageously, the films of the invention have a thickness greater than or equal to 50 microns.

The roughness of the layer (B) may be contributed by the presence of fine fillers present in the polymer. The filler present in the layer (B) may correspond to fine particles introduced into the polymer composition and/or to particles originating from catalyst residues. The roughness is preferably imparted by the introduction of fine inert particles into the polymer composition intended to produce the layer (B) after drawing.

Advantageously, the volume median diameter of the filler which is introduced is at least equal to the thickness of the layer containing it, the volume median diameter being generally between 1 and 10 microns and preferably between 1 and 5 microns. The concentration of filler introduced is generally between 0.02% and 1% and preferably between 0.2 and 0.5%.

The nature of the inert particles which are added may vary widely: they may be inorganic particles (oxides or salts of elements of groups II, III and IV of the Periodic Table of the elements) or polymer particles. By way of illustration there may be mentioned among the usable fillers: silica, silicoaluminates, calcium carbonate, MgO, $Al_2O_3$, $BaSO_4$, $TiO_2$ and the like. Advantageously, the filler employed will be calcium carbonate (natural variety or obtained by precipitation) which in this technology makes it possible to obtain a particularly low value of the percentage of scattered light. The composite films of the invention containing calcium carbonate also form a subject of the present invention.

If desired, the layer (A) may contain particles in a low quantity but it is quite obvious that the latter will have to be present at a low concentration and/or to have such dimensions that they do not appreciably influence the overall value of the percentage of light scattered by the film. It is possible, for example, to recycle into the polymer composition which is to form the layer (A) a proportion of scrap of the complex film of the present invention, without harming the transparency. The quantity of filler introduced in this way is, in fact, very low, since the thickness of the filled layer of the complex film represents only a small proportion of the overall thickness of the complex film.

The layer (A) may, if desired, itself be a composite layer.

The composite film of the present invention may comprise a single layer (B). It will then be a transparent two-layer film with unsymmetrical roughnesses which will comprise a relatively smooth layer and a rough layer.

The composite film of the present invention may be a film consisting of one layer (A) and two layers (B) as defined earlier. On this assumption, this will involve films on its two faces which are rough and capable of being symmetrical or unsymmetrical depending on whether the layers (B) are identical or not.

Preferably, the composite film of the invention will comprise two layers (B) whose characteristics will be identical or slightly different (symmetrical or unsymmetrical films).

According to an alternative form of the invention, the ratio of the thicknesses of the two layers (B) and (A) will be advantageously less than 3%, this feature enabling the transparency to be raised further.

Thus, the polyester films of the present invention have a thickness of between 40 and 300 microns and comprise a thick layer (A) generally covered over at least one surface with a very thin layer (B) whose thickness will generally be between 0.3 and 3 microns and preferably between 0.5 and 2 microns.

According to another alternative form of the present invention, the composite polyester films will have a roughness greater than 0.3 micron and preferably between 0.4 and 2 microns, while the percentage of scattered transmitted light will have a value of less than 5.

As already stated, the layers (A) and (B) forming the complex film of the present invention consist of crystalline or semicrystalline polyesters. Within the meaning of the invention, a crystalline or semi-crystalline polyester means a polyester which after melt extrusion through a slit die followed by biaxial drawing of the amorphous film produces a film of a crystalline or semicrystalline nature and having satisfactory properties which enable it to form a support film or a support layer for a composite film [high modulus, dimensional stability and the like].

The evidence of the crystallizability or of the crystallinity of the polymers is revealed by any means known to the specialist, such as, for example, by differential thermal analysis, which shows the crystallization or crystal melting peaks. In this connection, reference may be made to the paper by S. M. Lin and J. L. Koenig in the Journal of Polymer Science Polymer Symposium 71, 121–135 (1984); the degree of crystallinity of the polymer layer in the film increases with the increase of the surface area of the peak which is observed in differential thermal analysis and is obviously a function of the nature of the polymer and of the physical treatments [for example: drawing and the like] and/or the thermal treatments which it has undergone [heat-setting].

The measurement of density [a considerable change in density] also makes it possible to check in a simple manner whether the polyester is in the crystalline or semicrystalline state.

It should be understood within the scope of the present invention that drawn film refers to any film obtained after at least one unidirectional drawing operation performed on an amorphous film so as to endow the film with a satisfactory combination of mechanical properties (high modulus, good dimensional stability and the like). This may thus involve a uniaxial or biaxial drawing performed in succession or simultaneously in two directions, which are in general at right angles, or, yet again, sequences of at least 3 drawing operations in which the draw direction is changed at each sequence. Furthermore, each unidirectional drawing may itself be performed in several stages. It is thus possible to combine drawing sequences such as, for example, two successive biaxial drawing treatments, each drawing being capable of being performed in several stages.

Lastly, according to an advantageous alternative form of the present invention, the films such as those defined above have been subjected to a treatment of biaxial drawing in two directions at right angles to each other.

The composite films of the invention are films made of polyester which may consist of any straight-chain or substantially straight-chain film-forming polyester and leading to crystalline or semicrystalline polyesters. The polyesters are produced from one or more dicarboxylic acid(s) or from their lower alkyl esters, (terephthalic acid, isophthalic acid, 2,5-naphthalenedicarboxylic acid, 2,6-naphthalenedicarboxylic acid, 2,7-naphthalenedicarboxylic acid, succinic acid, sebacic acid, adipic acid, azelaic acid, diphenyldicarboxylic acid and hexahydroterephthalic acid) and from one or more diols or polyols such as ethylene glycol, 1,3-propanediol, 1,4-butanediol, neopentyl glycol and 1,4-cyclohexanedimethanol, polyoxyalkylene glycols (polyoxyethylene glycol, polyoxypropylene glycol or random or block copolymers thereof).

In general, the polyesters employed are homopolymers or copolymers containing essentially alkylene terephthalate repeat units; preferably, the said polyesters comprise at least 80% by weight of ethylene terephthalate repeat units and, still more preferably, at least 90% by weight of such repeat units. The polyester may also be a mixture of several polycondensates of which 80% by weight and preferably 90% by weight are polyethylene terephthalate.

Advantageously, the polyester is a polyethylene terephthalate whose intrinsic viscosity IV measured at 25° C. in o-chlorophenol is between 0.6 and 0.75 dl/g.

The preparation of such polyesters is known per se. The catalysts, stabilizers and additives employed are not critical. The latter may, nevertheless, be chosen so that they do not give rise, within the polyester resin which is to form the layer (A), to solid particles originating from the catalyst residues and capable of altering the surface quality and the transparency in a detrimental manner. If desired, the catalysts may give rise to particles of a minimal size whose dimensions have no effect on the surface quality of the film.

The fillers will preferably be introduced at the end of the esterification or interchange phase, in the form of a suspension of the particles in the diol employed (or, according to yet another possible alternative form, in one of the diols employed).

Such suspensions may be produced by merely milling the filler or the fillers dispersed in the appropriate diol, this may also involve a milling operation followed by centrifuging or filtration which enables the coarsest particles and the agglomerates of particles to be removed; the filler suspensions may also be homogenized by means of known techniques such as, for example, an appropriate treatment using ultrasonic waves. These methods make it possible to adjust the volume median diameter and the particle size distributions.

It is also possible to prepare beforehand a batch of polyester containing the fillers and then to mix this polyester with an unfilled polyester before the amorphous film is extruded.

The composite polyester films of the present invention may be produced by various conventional processes. They are advantageously produced by coextrusion of at least one filled polyester resulting in amorphous films becoming crystalline after they have been subjected to a drawing treatment and then to a heat-setting treatment. The drawing operation may be performed successively: firstly a drawing in the machine direction (lengthwise drawing) followed by a drawing at right angles to the machine direction (transverse drawing) or vice versa, that is to say a transverse drawing followed by a lengthwise drawing. The data which will follow relate more especially to the polyesters and particularly to polyethylene terephthalate.

Generally, in the case of the latter, the lengthwise drawing is performed with a ratio of 3 to 5 (that is to say that the length of the drawn film represents from 3 to 5 times the length of the amorphous film) and at a temperature of 80° to 100° C. for the polyester, and the transverse drawing is performed with a ratio of 3 to 5 at a temperature of 90° to 120° C.

The drawing operation may also be performed simultaneously in two directions at right angles to each other (usually lengthwise direction and transverse direction), for example with a ratio of 3 to 5 in each direction and at a temperature of 80° to 140° C.

Depending on the choice of the drawing conditions it is possible to generate individual surface morphologies such as the presence of cavities surrounding a protuberance, this being done by choosing the polymer and/or the drawing conditions.

After the drawing operation the film is heat-set in a manner which is also known per se, generally at a temperature of 180° to 230° C.

The invention also relates to the processes for producing the composite films such as those defined above.

The invention relates in particular to a process for producing polyester films such as those defined above, by coextruding, and then drawing and heat-setting at least one unfilled polyester and a filled polyester, the process being characterized in that:
  the filled polyester represents at most 5% by weight of the unfilled polyester
  the filled polyester contains from 0.02 to 0.5% of a fine filler whose volume median diameter is between 1 and 10 microns and preferably between 1 and 5.

The composite films according to the invention, with their high roughness and particularly when the latter is greater than 0.4 micron, are of particular interest in graphic arts application, particularly in view of their transparency, their anti-Newton character and the possibility of their being used at a high rate in photogravure machines. However, the composite films of the present invention are also of great interest in the photocopying field, where films which have good processability and fast lay-down properties are required; the films of the invention can be used with continuous packet feed whereas the traditional use of polyester films permits only sheet-bysheet feed.

Where appropriate, coating may be used to improve the use properties of the film, by endowing it with an antistatic character with the aid of known coatings, or with improved anchoring properties towards subsequent coating layers.

The properties of the films of the present invention, and the characteristics of the fillers introduced are measured as follows:

Anti-Newton character:

The anti-Newton character may be checked by making an impression of a positive offset plate through two sheets of the film to be tested, using a 50% polychrome screen. No Newton ring should be seen on the plate after development. It is also possible to use the following test: in contact reproduction of an original on a silver file, the Newton's rings are made to disappear on the reproduction when the claimed film is inserted between glass and original to be reproduced by contact.

Roughnesses:

The roughness of a film is generally expressed by means of two values:
a value corresponding to the total roughness $R_t$
a value corresponding to the average roughness $R_a$ (also called CLA in accordance with the English terminology "center line average").

The total roughness $R_t$ and the average roughness $R_a$ are defined and their measurements are described in the ISO international standard R 468.

The total roughness is measured according to the international standard with the aid of a PERTHEN W 5 B apparatus.

The measurement corresponds to the mean of 10 results, the various measurement parameters being chosen as follows: limit or cut-off wavelength value: 0.08 micron; feel length: 1.5mm; feeler curvature radius: 5 microns; feeler pressure force: 30 mg.

Percentage of centered transmitted light (haze):

this measurement characterizes the cloudiness of the films; it is measured according to the standard ASTM D 100.

Volume median diameter:

The volume median diameter is the spherical diameter corresponding to 50% of the volume of the combination of the particles read off on the cumulative distribution curve relating the volume % to the particle diameter.

The spherical equivalent diameter of a particle means the diameter of a sphere having a volume equivalent to that of the particle.

The particle size distribution curve is established according to various methods described in the prior art and in particular by photometry with centrifuging with the aid of the HORIBA/CAPA 500 apparatus.

This method makes it possible to measure the change in the absorbance of a suspension in which the particles sediment as a function of the time t. This absorbance is defined by the relationship $$Ln \frac{I_o}{I}$$

and it is related in the characteristics of the suspension by the formula:

$$\left[ Ln \frac{I_o}{I} \right]_{d_x} = K \, E(d_x), \, n(d_x), \, (d_x)^2$$

$I_o$: light transmitted by the pure liquid
$I$: light transmitted by the suspension
$K$: constant which is a function of the concentration of the suspension and of the cell thickness.

$E(d_M)$: extinction coefficient (taken as equal to 1 whatever the diameter)
$n(d_x)$: number of particles of diameter $d_x$.

The rate of sedimentation is related to the spherical equivalent diameter of the particles via the Stokes formula.

(Cf. work by T. ALLEN: Particle Size Measurement) Third edition 1981)

Measurement of the coefficient of friction

This is the determination of the film/film friction measured at an initial movement (static coefficient) or in movement (dynamic value) when a film moves in relation to another at a low speed.

This measurement is standardized (standard 311 A British Standard 2782).

Test for laying down on copying frames [printing-down frames]

Tests for positioning by laying down in industrial frames were carried out on large-format frames having the following dimensions: 700×1000 mm.

A systematic study has made it possible to establish a hierarchy of the films in the following manner, with the aid of the following ratings:

rating C: behaviour of the usual polyester films
rating B: improvement appreciable but less than 50%
rating A: laying down time greatly reduced with more than 50% improvement in output.

EXAMPLE 1

A composite film with three layers of polyethylene terephthalate is produced, the two outer layers B and B' being filled, the inner layer A not being filled. The polyethylene terephthalate polymers have been obtained by transesterification starting with dimethyl terephthalate and ethylene glycol, using manganese acetate as interchange catalyst, followed by a polycondensation using antimony oxide as catalyst, which brings the polymer viscosity to IV=0.64.

The filler present in the outer layers in a proportion by weight of 0.35% (i.e. 3500 ppm) is a calcium carbonate introduced in the form of a glycol suspension which is incorporated in the reaction mixture at the end of the interchange. The particle size distribution is characterized by the volume median diameter: median $\phi_v = 3$ microns (measured using the HORIBA/CAPA 500).

The total thickness of the film is: 125 microns.

The thickness of each surface layer is 1 micron ($e_2/e_1$ ratio = 0.813%)

Thus, after a biaxial drawing operation performed under the usual conditions (lengthwise followed by transverse) a film having the anti-Newton character is obtained, with the following characteristics:

percentage of scattered light: 3
roughness $R_t = 0.90$ micron
roughness $R_a = 0.08$ micron
static friction coefficient $\mu_s = 0.38$
dynamic friction coefficient $\mu_d = 0.35$ (The coefficients of frictions are measured by rubbing a face 1 of the film over the face 2).

This film permits rapid positioning of the documents in the printing frames (manufacture of offset plates). Its rating is A in the test for laying down on printing frames.

EXAMPLE 2

An unsymmetrical film containing 3 layers of polyethylene terephthalate, constituted as follows, is produced:

1 outer layer B of thickness $e_2 = 0.5$ micron, BaSO$_4$ filled: at 0.2% — median $\phi_v = 4$ microns.
1 unfilled inner layer A: 172.5 microns
1 outer layer B' of thickness $e'_2 = 2$ microns filled as layer B.
$e_2/e_1 = 1.16\%$
$e'_2/e_1 = 2.32\%$
Results:
face B roughness: $R_t = 0.4$ micron
face B' roughness: $R_t = 1$ micron
percentage of scattered light: 3.5
coefficients of friction:
$\mu_s = 0.38$
$\mu_d = 0.35$ This film has the anti-Newton character when the face B' is used. Its rating is A in the test for laying down on printing frames.

EXAMPLE 3

An unsymmetrical film containing three layers having a total thickness of 125 microns is produced. The surface layers have a thickness of 0.5 micron (layer B) and 2 microns (layer B'), respectively, and are filled with Syloid 244$^R$ silica
median $\phi_v$: 2 microns
weight concentration: 0.2% (in the 2 layers)
$e_2/e_1$: 0.4%
$e'_2/e_1$: 1.60%
Film characteristics:
percentage of scattered light: 3
roughness $R_t$: 0.65 micron (layer B') $R_t$: 0.3 micron (layer B)
coefficient of friction:
$\mu_s$: 0.4
$\mu_d$: 0.36

This film is anti-Newton. It has been the subject of manufacture on an industrial scale. It can be used at a high rate in machines intended for the manufacture of printing formes for offset plates. Its rating is A in the test for laying down on printing frames.

EXAMPLE 4

An unsymmetrical film containing three layers having an overall thickness of 125 microns is produced. The surface layers have a thickness of 0.5 micron (layer B) and 2 microns (layer B'), respectively, and are filled with calcium carbonate
median $\phi_v$: 2.1 microns
weight concentration: 0.25% (in the 2 layers)
$e_2/e_1$: 0.4%
$e'_2/e_1$: 1.60%
Film characteristics:
percentage of scattered light: 3
roughness $R_t$: 0.45 micron (layer B') $R_t$: 0.25 micron (layer B)
coefficient of friction:
$\mu_s$: 0.4
$\mu_d$: 0.36

The film can be used at a high rate in machines intended for the manufacture of printing formes. Its rating is A.

EXAMPLE 5

A symmetrical film containing three layers having an overall thickness of 170 microns is produced on an industrial line. The surface layers have a thickness of 1.5 microns and are filled with silica
median $\phi_v$: 1.23 microns
weight concentration: 0.25 percent (in the 2 layers)
$e_2/e_1$: 0.9%
$e'_2/e_1$: 0.9%
Film characteristics:
percentage of scattered light: 4.3
roughness $R_t$: 0.72 micron
coefficient of friction:
$\mu_s$: 0.39
$\mu_d$: 0.29

This film is anti-Newton. It can be used at a high rate in machines intended for the manufacture of printing formes for offset plates. Its rating is A in the test for laying down on printing frames.

COMPARATIVE EXAMPLES

Other tests are carried out for comparison, in which the overall thickness of the film, the quantity of filler and the median diameter of the filler are changed and the properties of the films [haze, roughness, coefficient of friction] are measured and the rating in the test for laying down on frames is determined. The results are as follows:

| Counter-part examples | Thicknesses in microns | | filler | | Haze | Roughness (microns) | | Test for laying down on a frame category |
|---|---|---|---|---|---|---|---|---|
| | Total | External layer | Median diameter $\phi_v$ (microns) | quantity (ppm) | | $R_T$ | $R_a$ | |
| 1 | 121 | 1.5 | 0.6 | 800 | 0.9 | 0.1 | 0.01 | C |
| 2 | 50 | 1.5 | 1.23 | 11000 | 16.2 | 1.15 | 0.05 | A |
| 3 | 50 | 2.0 | 0.8 | 7000 | | | | C |
| 4 | 23 | 1.0 | 1.23 | 2000 | 3.6 | 0.99 | 0.02 | B |
| 5 | 23 | 1.0 | 0.3 | 2000 | 1.2 | 0.23 | 0.01 | C |
| 6 | 12 | 0.45 | 1.23 | 2000 | 3.6 | 0.71 | 0.021 | C |
| 7 | 12 | 0.45 | 1.23 | 10000 | 12.8 | | | B |
| 8 | 12 | 0 | 1.23 | 3000 | 2.5 | | | C |

Conclusions: to have files which at the same time possess good transparency and a high roughness and which have an execellent speed of laying down on frames, it is necessary:
  to use thick films,
  to choose particular fillers having suitable mean diameters and to use appropriate quantities of filler.

It is noted, furthermore, that all the files are machinable [static friction coefficient < 0.50: dynamic friction coefficient < 0.40].

I claim:

1. A thick, composite graphic polyester arts film with a thickness of between 40 and 300 microns, drawn, crystalline or semi-crystalline, comprising a drawn layer (A) of thickness $e_1$, layer (A) being essentially unfilled and being covered on at least one of its faces with a thin drawn layer (B), drawn layer (B), of thickness $e_2$, having an overall roughness greater than 0.3 micron and being filled with inert particles, the volume median diameter of the filler being at least equal to the thickness of the layer, wherein:

(i) the ratio of the thicknesses of the layers (B) and (A) denoted by $e_2/e_1$ is lower than 5%; and (ii) the percentage of scattered light transmitted from the composite film is lower than 7.

2. A film according to claim 1, in which the volume median diameter of the filler is between 1 and 10 microns.

3. A film according to claim 1, in which the quantity of filler introduced into the film (B) is between 0.02% and 1%.

4. A film according to claim 1, in which the ratio of the thicknesses of the two layers (B) and (A) is lower than 3%.

5. A film according to claim 1, having a value of the percentage of scattered transmitted light lower than 5.

6. A film according to claim 1 characterized in that they are made of polyethylene terephthalate.

* * * * *